United States Patent
Huang et al.

(10) Patent No.: US 12,057,851 B2
(45) Date of Patent: Aug. 6, 2024

(54) TIME-INTERLEAVED ANALOG-TO-DIGITAL CONVERTER

(71) Applicant: REALTEK SEMICONDUCTOR CORPORATION, Hsinchu (TW)

(72) Inventors: Shih-Hsiung Huang, Hsinchu (TW); Jun Yang, Suzhou (TW); Yu-Chang Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 202 days.

(21) Appl. No.: 17/946,521

(22) Filed: Sep. 16, 2022

(65) Prior Publication Data

US 2023/0163770 A1 May 25, 2023

(30) Foreign Application Priority Data

Nov. 19, 2021 (CN) .......................... 202111391956.5

(51) Int. Cl.
*H03M 1/06* (2006.01)
*H03M 1/08* (2006.01)
(Continued)

(52) U.S. Cl.
CPC ....... *H03M 1/0604* (2013.01); *H03M 1/0624* (2013.01); *H03M 1/0626* (2013.01);
(Continued)

(58) Field of Classification Search
CPC ............. H03M 1/0604; H03M 1/0624; H03M 1/0626; H03M 1/1038; H03M 1/1215; H03M 1/0836; H03M 1/121
(Continued)

(56) References Cited

U.S. PATENT DOCUMENTS 7,250,885 B1 * 7/2007 Nairn .................. H03M 1/1215
341/155
7,292,170 B2 11/2007 Kinyua
(Continued)

FOREIGN PATENT DOCUMENTS

CN 101888247 A 11/2010

OTHER PUBLICATIONS

Vaz et al. "Session 16 Gigahertz Data Converters", ISSCC 2017, Institute of Electrical and Electronics Engineers, Unversity of Pennsylvania, USA.
(Continued)

*Primary Examiner* — Khai M Nguyen
(74) *Attorney, Agent, or Firm* — WPAT, P.C

(57) ABSTRACT

A time-interleaved analog-to-digital converter (TIADC) operates in a first mode or a second mode and includes M analog-to-digital converters (ADCs), a reference ADC, a digital correction circuit, and a control circuit. The M ADCs sample an input signal according to M enable signals to generate M digital output codes. The reference ADC samples the input signal according to a reference enable signal to generate a reference digital output code. The digital correction circuit corrects the M digital output codes to generate M corrected digital output codes. The control circuit generates the M enable signals and the reference enable signal according to a clock. The control circuit outputs the M corrected digital output codes in turn but does not output the reference digital output code in the first mode and randomly outputs the M corrected digital output codes and the reference digital output code in the second mode.

15 Claims, 7 Drawing Sheets

(51) Int. Cl.
*H03M 1/10* (2006.01)
*H03M 1/12* (2006.01)

(52) U.S. Cl.
CPC ....... *H03M 1/0836* (2013.01); *H03M 1/1038* (2013.01); *H03M 1/1215* (2013.01); *H03M 1/121* (2013.01)

(58) Field of Classification Search
USPC .......................................... 341/118, 120, 155
See application file for complete search history.

(56) References Cited

U.S. PATENT DOCUMENTS

| | | | |
|---|---|---|---|
| 9,608,652 B2 * | 3/2017 | Lee | H03M 1/0836 |
| 10,868,556 B2 | 12/2020 | Camponeschi | |
| 2006/0279445 A1 | 12/2006 | Kinyua | |
| 2016/0049949 A1 | 2/2016 | Waltari | |
| 2020/0235748 A1 | 7/2020 | Kang | |
| 2021/0359694 A1 | 11/2021 | Chen | |

OTHER PUBLICATIONS

Devarajan et al. "A 12b 10GS/s Interleaved Pipeline ADC in 28nm CMOS Technology", ISSCC 2017, IEEE International Solid-State Circuits Conference.

* cited by examiner

| time point | ... | t2 | t3 | t4 | t5 | t6 | t7 | t8 |
|---|---|---|---|---|---|---|---|---|
| object to be corrected | ... | -- | 110_1 | -- | -- | -- | -- | 110_2 |

| time point | t9 | t10 | t11 | t12 | t13 | t14 | t15 | ... |
|---|---|---|---|---|---|---|---|---|
| object to be corrected | -- | -- | -- | -- | 110_3 | -- | -- | ... |

FIG. 4

| time point | t1 | t2 | t3 | t4 | t5 | t6 | t7 |
|---|---|---|---|---|---|---|---|
| candidate ADCs | 115/ 110_4 | 115/ 110_1 | 115/ 110_2 | 115/ 110_3 | 115/ 110_4 | 110_1/ 110_4 | 110_2/ 110_4 |
| selected ADC | 110_4 | 110_1 | 110_2 | 110_3 | 115 | 110_1 | 110_2 |

| time point | t8 | t9 | t10 | t11 | t12 | t13 | t14 |
|---|---|---|---|---|---|---|---|
| candidate ADCs | 110_3/ 110_4 | 115/ 110_3 | 115/ 110_1 | 110_1/ 110_2 | 110_1/ 110_4 | 110_4/ 110_3 | 110_4/ 115 |
| selected ADC | 110_4 | 110_3 | 115 | 110_2 | 110_1 | 110_3 | 115 |

FIG. 6

TIME-INTERLEAVED ANALOG-TO-DIGITAL CONVERTER

BACKGROUND OF THE INVENTION

1. Field of the Invention

The present invention generally relates to time-interleaved analog-to-digital converters (ADCs), and, more particularly, to the suppression of timing skew tones caused by the sampling timing skew of the time-interleaved ADCs (TIADCs).

2. Description of Related Art

A TIADC includes multiple sub-ADCs, which, according to multiple sampling clocks that are the same in frequency but different in phases, sample the input signal to generate their respective digital output codes in turn as the output of the TIADC. For example, for a TIADC that includes four sub-ADCs (ADC1, ADC2, ADC3, and ADC4) that sample the input signal in the order of ADC1→ADC2→ADC3→ADC4→ADC1→ADC2→ . . . , the phase difference between the sampling clock of ADC1 and the sampling clock of ADC2 is 90 degrees, the phase difference between the sampling clock of ADC2 and the sampling clock of ADC3 is 90 degrees, the phase difference between the sampling clock of ADC3 and the sampling clock of ADC4 is 90 degrees, and the phase difference between the sampling clock of ADC4 and the sampling clock of ADC1 is 90 degrees. If the frequency of the operating clock of the TIADC is fs (i.e., the TIADC outputs a digital output code every 1/fs second), the frequency of the sampling clocks of ADC1, ADC2, ADC3, and ADC4 is fs/4.

Unfortunately, several factors, such as the trace length, component mismatch, etc., cause the sampling clocks of the sub-ADCs ADC2, ADC3, and ADC4 to phase shift from their ideal values of exactly 90, 180, and 270 degrees, with respect to the phase of the sampling clock of the sub-ADC ADC1, to 90+x, 180+y, and 270+z degrees, respectively (x, y, z are rational numbers). The document "Behzad Razavi. Design Considerations for Interleaved ADCs. IEEE JOURNAL OF SOLID-STATE CIRCUITS, VOL. 48, NO. 8, AUGUST 2013" provides a method of obtaining the values of x, y, and z.

Conventionally, the method of correcting the TIADC uses three filters to respectively adjust the digital output codes of the sub-ADCs ADC2, ADC3, and ADC4 according to the values of x, y, and z, respectively, so as to compensate for or correct the mistakes cause by the phase errors (i.e., x, y, z). This method, however, is not only slow in convergence, but usually left with the residual timing skew tone, gain tone, and offset tone in the frequency domain for the corrected TIADC, among which the residual timing skew tone is the most difficult to deal with since the residual timing skew tone implies that the phase differences between the corrected sampling clocks are not the desired 90, 180, and 270 degrees but are, for example, 90+x1, 180+y1, and 270+z1 degrees (x1, y1, z1 being the residual values). The residual values x1, y1, z1 being non-zero constants gives rise to the occurrence of the undesirable timing skew tones, which may not only degrade the performance of TIADCs but even cause errors in other circuits.

SUMMARY OF THE INVENTION

In view of the issues of the prior art, an object of the present invention is to provide TIADCs, so as to make an improvement to the prior art.

According to one aspect of the present invention, a time-interleaved analog-to-digital converter (TIADC) which operates in a first mode or a second mode is provided. The TIADC includes M ADCs, a reference analog-to-digital converter (ADC), a digital correction circuit, and a control circuit. The M ADCs sample an input signal according to M enable signals to generate M digital output codes, M being an integer greater than one. The reference ADC samples the input signal according to a reference enable signal to generate a reference digital output code. The digital correction circuit corrects the M digital output codes to generate M corrected digital output codes. The control circuit generates the M enable signals and the reference enable signal according to a clock. In the first mode, the control circuit outputs the M corrected digital output codes in turn but does not output the reference digital output code. In the second mode, the control circuit randomly outputs the M corrected digital output codes and the reference digital output code.

According to another aspect of the present invention, a time-interleaved analog-to-digital converter (TIADC) which operates in a first mode or a second mode to convert an input signal into a digital output signal is provided. The TIADC includes a first ADC, a second ADC, a third ADC, a fourth ADC, a reference ADC, a digital correction circuit, and a control circuit. The first ADC receives the input signal and samples the input signal according to a first enable signal to generate a first digital output code. The second ADC receives the input signal and samples the input signal according to a second enable signal to generate a second digital output code. The third ADC receives the input signal and samples the input signal according to a third enable signal to generate a third digital output code. The fourth ADC receives the input signal and samples the input signal according to a fourth enable signal to generate a fourth digital output code. The reference ADC receives the input signal and samples the input signal according to a reference enable signal to generate a reference digital output code. The digital correction circuit corrects the first digital output code, the second digital output code, the third digital output code, and the fourth digital output code to respectively generate a first corrected digital output code, a second corrected digital output code, a third corrected digital output code, and a fourth corrected digital output code. The control circuit generates the first enable signal, the second enable signal, the third enable signal, the fourth enable signal, and the reference enable signal according to a clock. In the first mode, the digital output signal is selected from a first digital output code group including the first corrected digital output code, the second corrected digital output code, the third corrected digital output code, and the fourth corrected digital output code. In the second mode, the digital output signal is selected from a second digital output code group including the first corrected digital output code, the second corrected digital output code, the third corrected digital output code, the fourth corrected digital output code, and the reference digital output code.

The TIADCs of the present invention can suppress the timing skew tone, gain tone, and, offset tone as well as improve the convergence.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 4 shows the to-be-corrected objects of the digital correction circuit and the digital output signal.

FIG. 6 shows the candidate values of the digital output signal and the digital output signal.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes time-interleaved analog-to-digital converters (TIADCs). On account of that some or all elements of the TIADCs could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
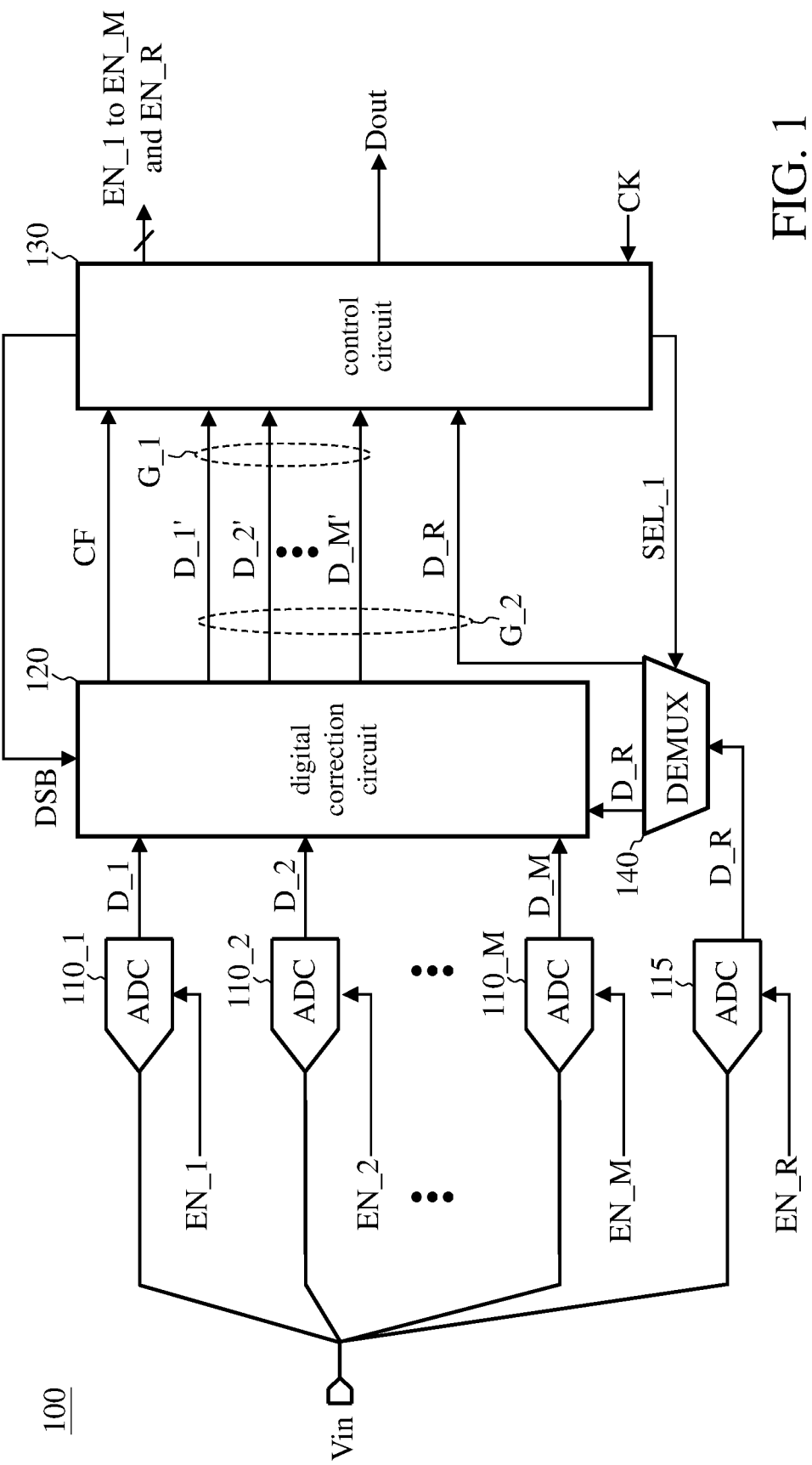
FIG. 1 is a functional block diagram of a TIADC according to an embodiment of the present invention.

FIG. 1 is a functional block diagram of a TIADC according to an embodiment of the present invention. The TIADC 100 includes M ADCs 110 (ADC 110_1, ADC 110_2, . . . , ADC 110_M, M being an integer greater than 1), a reference ADC 115, a digital correction circuit 120, a control circuit 130, and a demultiplexer (DEMUX) 140. The ADCs 110 and the reference ADC 115 receive the input signal Vin. The digital correction circuit 120 is coupled to the ADCs 110, the control circuit 130, and the demultiplexer 140. The demultiplexer 140 is coupled to the reference ADC 115, the digital correction circuit 120, and the control circuit 130.

The ADC 110_1 samples the input signal Vin according to the enable signal EN_1 and generates the digital output code D_1; the ADC 110_2 samples the input signal Vin according to the enable signal EN_2 and generates the digital output code D_2; the ADC 110_M samples the input signal Vin according to the enable signal EN_M and generates the digital output code D_M. The reference ADC 115 samples the input signal Vin according to the reference enable signal EN_R and generates the reference digital output code D_R.

The digital correction circuit 120 corrects the digital output codes D_1, D_2, . . . , D_M to generate the corrected digital output codes D_1', D_2', . . . , and D_M', respectively. The M corrected digital output codes constitute the first digital output code group G_1. The M corrected digital output codes and the reference digital output code D_R constitute the second digital output code group G_2. The digital correction circuit 120 corrects the skew tone, gain tone, and offset tone resulting from the mismatch(es) between the M ADCs 110. In some embodiments, the digital correction circuit 120 includes a plurality of filters, and the digital correction circuit 120 adjusts the coefficients of the filters to improve the correction effect. Using filters to adjust or correct the digital output codes is well known to people having ordinary skill in the art, and the details are omitted for brevity. In some cases, if the digital output code D_k does not need to be corrected, the corrected digital output code D_k' is identical to the digital output code D_k ($1 \leq k \leq M$).

The control circuit 130 receives the first digital output code group G_1 and the second digital output code group G_2, outputs the digital output signal Dout, and generates the M enable signals (EN_1, EN_2, . . . , EN_M) as well as the reference enable signal EN_R according to the clock CK.

The demultiplexer 140 receives the reference digital output code D_R and outputs the reference digital output code D_R to the digital correction circuit 120 or the control circuit 130 according to the selection signal SEL_1.

Figure 2:
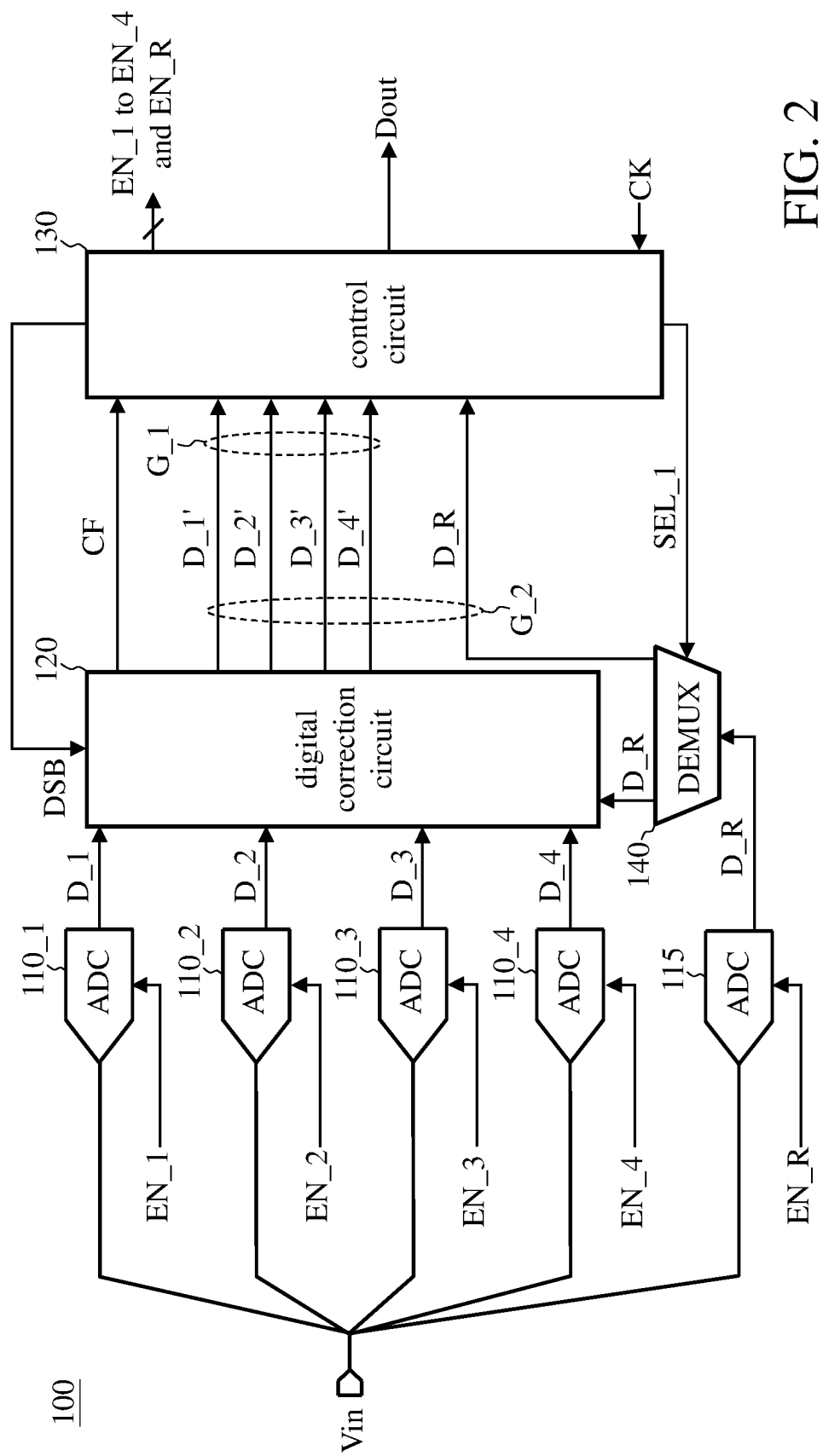
FIG. 2 is a functional block diagram of a TIADC according to another embodiment of the present invention.

The TIADC 100 operates in the first mode or the second mode. FIG. 2 shows the TIADC of the present invention where M=4. The first mode and the second mode of the TIADC of the present invention are discussed below in connection with FIGS. 2 to 6 with M being 4 for illustrative purposes.

In the first mode, the control circuit 130 controls, through the selection signal SEL_1, the demultiplexer 140 to output the reference digital output code D_R to the digital correction circuit 120; the digital correction circuit 120 corrects the M digital output codes (D_1, D_2, . . . , D_M) according to the reference digital output code D_R to generate M corrected digital output codes (D_1', D_2', . . . , D_M') respectively; and the control circuit 130 selects a corrected digital output code from the first digital output code group G_1 and outputs the same as the digital output signal Dout. In some embodiments, when the digital correction circuit 120 is embodied by multiple filters, the digital correction circuit 120 continuously adjusts the coefficients of the filters in the first mode.

Figure 3:
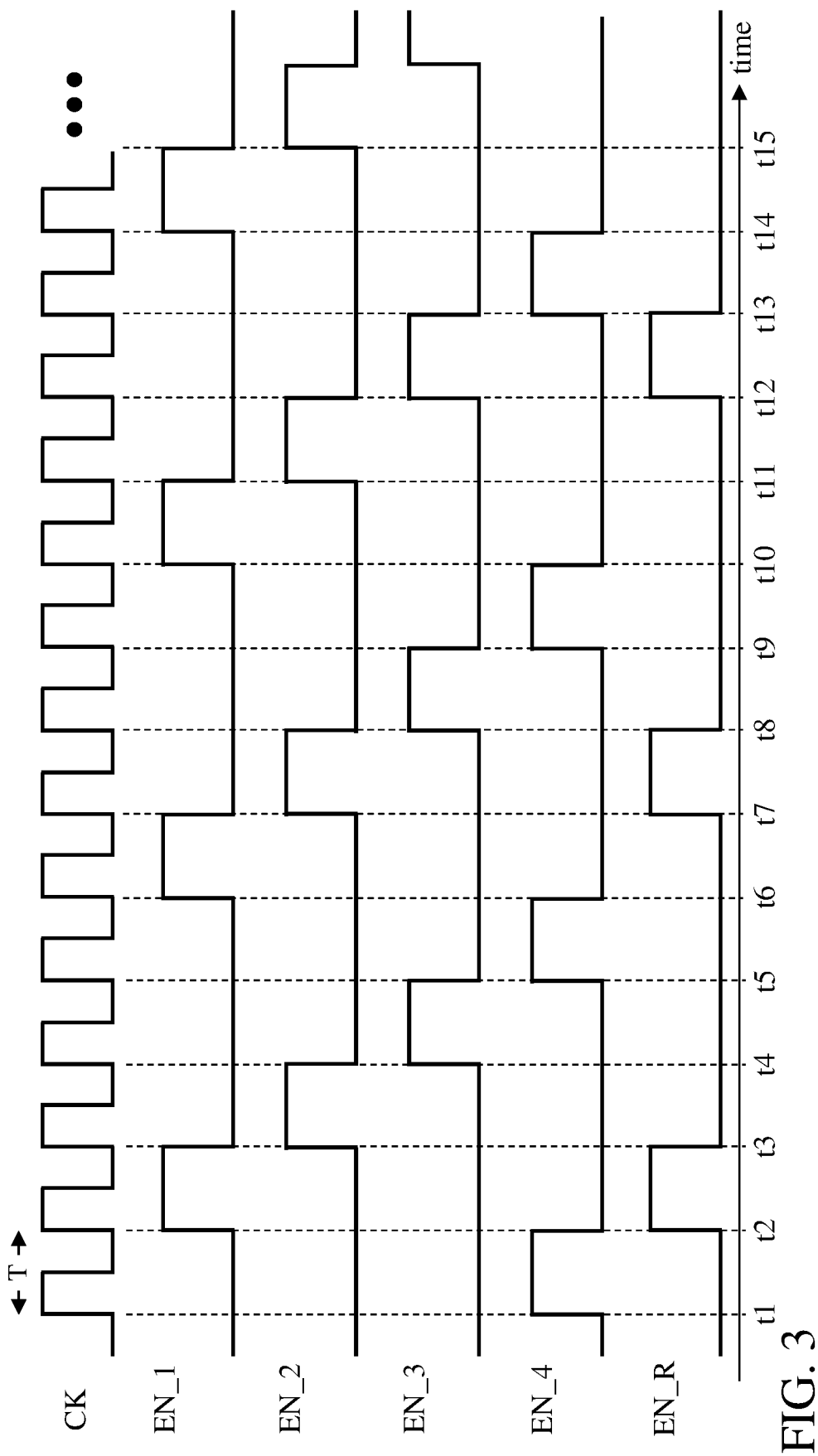
FIG. 3 is a timing diagram of the enable signals of the TIADC in the first mode according to the present invention.

Reference is made to FIGS. 2 to 4. FIG. 3 is a timing diagram of the enable signals for the TIADC 100 in the first mode according to the present invention, and FIG. 4 shows the object to be corrected by the digital correction circuit 120. The period of the clock CK is T, the periods of the enable signal EN_1, the enable signal EN_2, the enable signal EN_3, and the enable signal EN_4 are 4T, and the period of the reference enable signal EN_R is 5T. When the reference enable signal EN_R is aligned with a certain enable signal, the digital correction circuit 120 corrects the ADC corresponding to that enable signal. In the examples of FIG. 3 and FIG. 4, the digital correction circuit 120 corrects the ADC 110_1, the ADC 110_2, the ADC 110_3, and the ADC 110_4 according to the reference digital output code D_R at time point t3, time point t8, time point t13, and time point t18 (not shown) respectively, and the control circuit 130 periodically and sequentially (i.e., in turn) outputs the digital output codes D_1'→D_2'→D_3'→D_4'→D_1'→D_2', . . . as the digital output signal Dout.

In the first mode, the period of the reference enable signal EN_R is greater than the periods of the M enable signals (EN_1, EN_2, . . . , EN_M). In some embodiments, the periods of the M enable signals are P units, the period of the reference enable signal EN_R is Q units, and both P and Q are integers and mutually prime.

In the second mode, the control circuit 130 controls, through the selection signal SEL_1, the demultiplexer 140 to output the reference digital output code D_R to the control circuit 130, and the control circuit 130 selects a digital output code from the second digital output code group G_2 and outputs the same as the digital output signal Dout.

Figure 5:
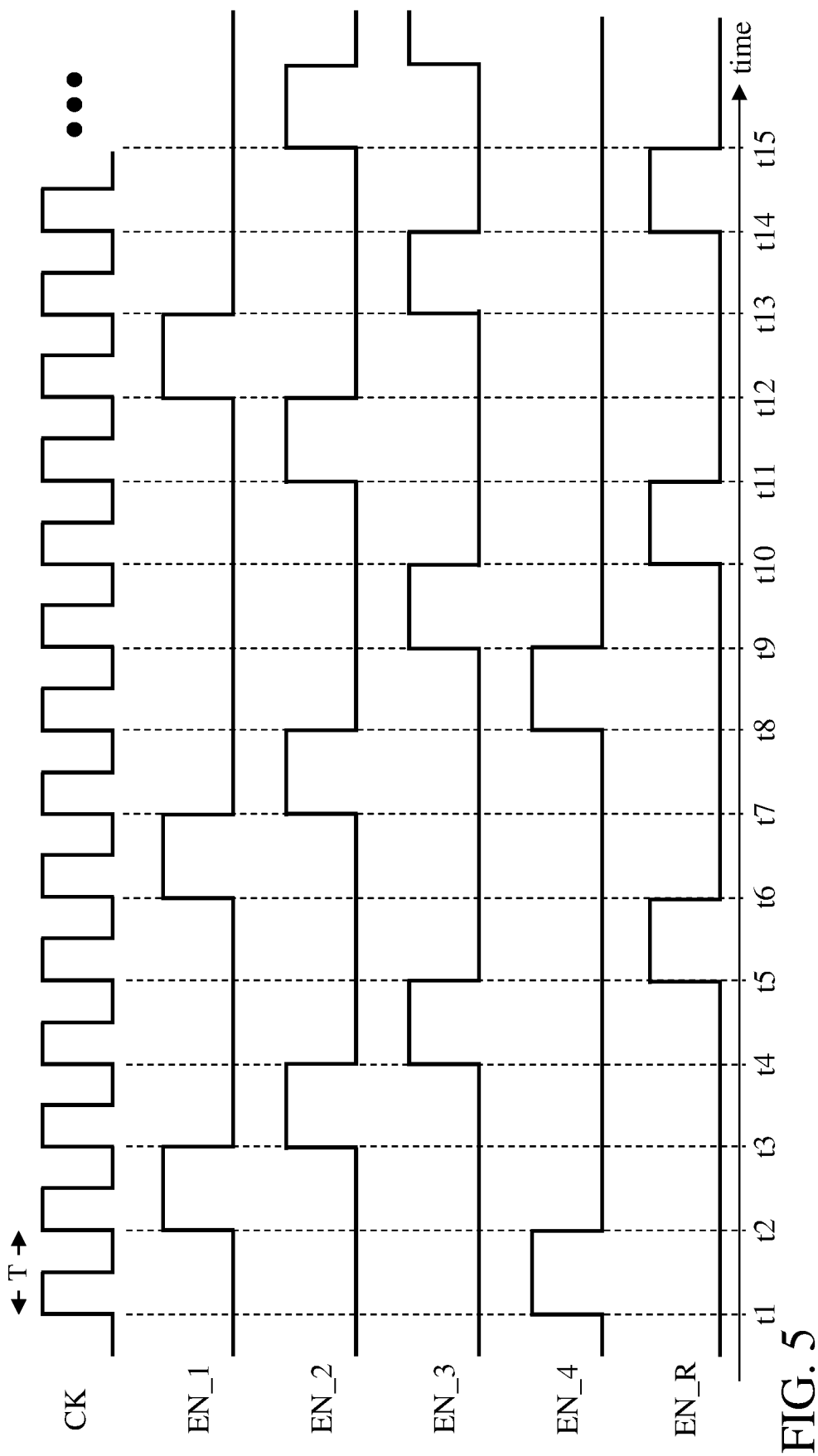
FIG. 5 is a timing diagram of the enable signals of the TIADC in the second mode according to the present invention.

Reference is made to FIGS. 2, 5 and 6. FIG. 5 is a timing diagram of the enable signals for the TIADC 100 in the second mode according to the present invention, and FIG. 6 shows the candidate ADCs and the selected ADC.

According to the clock CK, the control circuit 130 generates the enable signal EN_1, the enable signal EN_2, the enable signal EN_3, the enable signal EN_4, and the reference enable signal EN_R, which are not regular in periods. In some embodiments, the control circuit 130 generates the enable signals in a pseudo-random manner, which will be detailed below in connection with FIG. 6.

Reference is made to both FIG. 5 and FIG. 6. At time point t1, the candidate ADCs are the ADC 110_4 and the reference ADC 115, and the control circuit 130 selects one of them in a pseudo-random manner (in the example of FIG. 6, the ADC 110_4 is selected, corresponding to the enable signal EN_4 being high at time point t1 in FIG. 5); at time point t2, the candidate ADCs are the ADC 110_1 and the reference ADC 115, and the control circuit 130 selects one of them in a pseudo-random manner (in the example of FIG. 6, the ADC 110_1 is selected, corresponding to the enable signal EN_1 being high at time point t2 in FIG. 5); and so on.

Continuing the discussion above, over time, the digital output signal Dout presents a random pattern (e.g., Dout=D_4'→D_1'→D_2'→D_3'→D_R→D_1'→D_2'→D_4'→D_3'D_R→D_2'→D_1'→D_3'→D_R→ . . . , which corresponds to the timing diagram in FIG. 5), rather than a fixed pattern (e.g., D_1'→D_2'→D_3'→D_4'→D_1'→D_2' D_3'→ . . . ), which is equivalent of the control circuit 130 randomly outputting the M corrected digital output codes and the reference digital output code D_R as the digital output signal Dout in the second mode. Randomizing the digital output signal Dout makes for the suppression of the timing skew tone and improvements in the performance of the TIADC 100. For the implementation of pseudo random, please refer to: en.wikipedia.org/wiki/Pseudorandom_generator.

Figure 7:
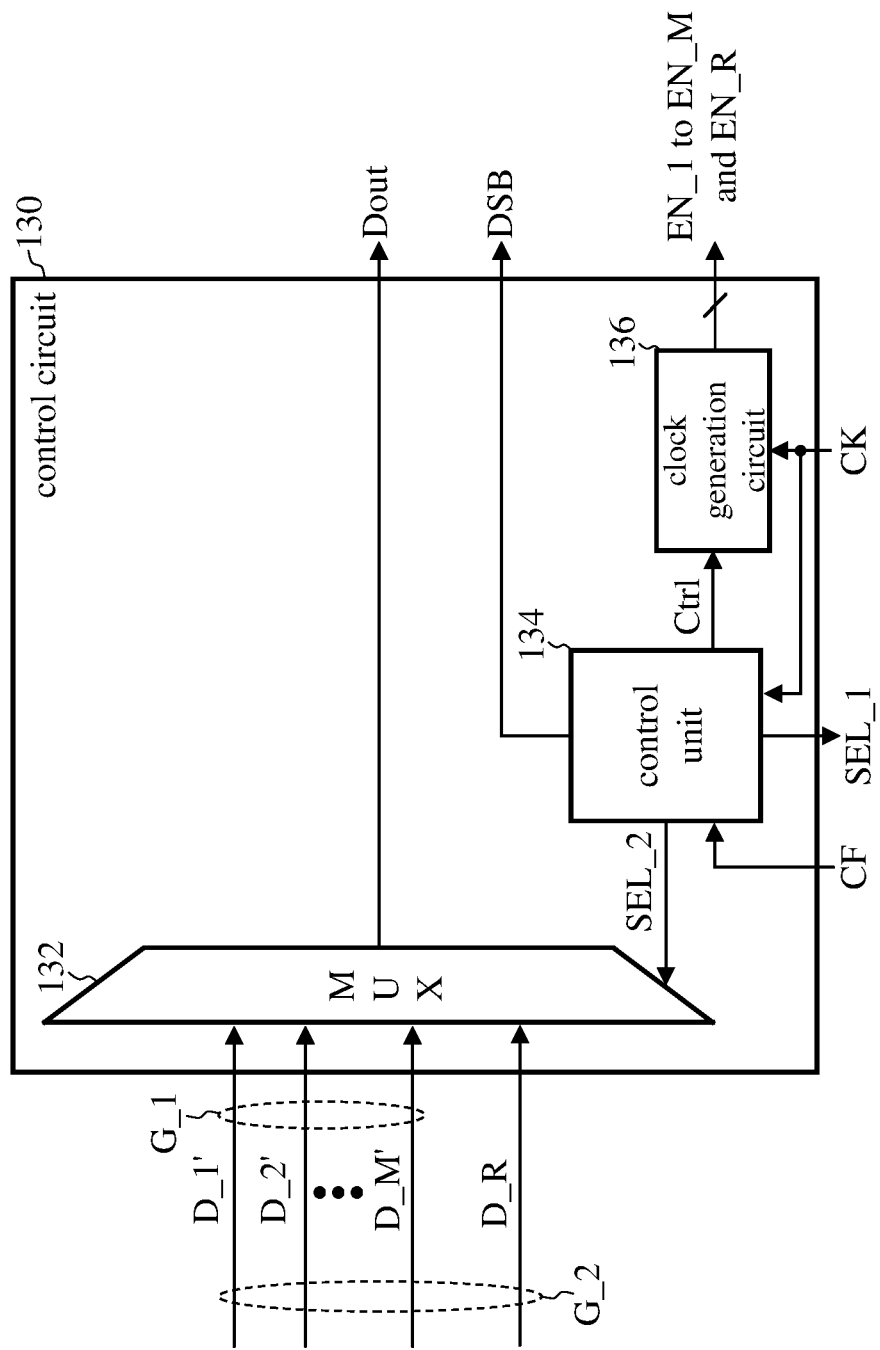
FIG. 7 is a functional block diagram of a control circuit according to an embodiment.

FIG. 7 is a functional block diagram of the control circuit 130 according to one embodiment. The control circuit 130 includes a selection circuit 132 (e.g., a multiplexer (MUX)), a control unit 134, and a clock generation circuit 136. The control unit 134 is coupled to the selection circuit 132 and the clock generation circuit 136.

The selection circuit 132 receives the first digital output code group G_1 (corresponding to the first mode) or the second digital output code group G_2 (corresponding to the second mode) and, according to the selection signal SEL_2 generated by the control unit 134, outputs a corrected digital output code from the first digital output code group G_1 as the digital output signal Dout (when the TIADC 100 operates in the first mode) or outputs a digital output code from the second digital output code group G_2 as the digital output signal Dout (when the TIADC 100 operates in the second mode).

The clock generation circuit 136 generates the M enable signals (EN_1, EN_2, . . . , EN_M) and the reference enable signal EN_R according to the clock CK and the control signal Ctrl. More specifically, in the first mode, the control unit 134 controls the clock generation circuit 136 with the control signal Ctrl, causing the period of the reference enable signal EN_R to be different from the periods of the M enable signals (e.g., the periods of the M enable signals are M*T, while the period of the reference enable signal EN_R is (M+1)*T); in the second mode, the control unit 134 controls the clock generation circuit 136 with the control signal Ctrl, causing the periods of the M enable signals and the reference enable signal EN_R to be unfixed (i.e., presenting a pseudo-random pattern). In some embodiments, the clock generation circuit 136 may be embodied by a phase interpolator. The use of a phase interpolator to generate and/or adjust a plurality of clocks is well known to people having ordinary skill in the art, and thus the details are omitted for brevity.

In some embodiments, the control unit 134 controls the TIADC 100 to operate in the first mode or the second mode by adjusting the selection signal SEL_1 and the control signal Ctrl according to the indication signal CF generated by the digital correction circuit 120. For example, when the indication signal CF indicates that the error amount of at least one of the M corrected digital output codes is smaller than a threshold, the control circuit 130 controls the TIADC 100 to operate in the second mode.

In some embodiments, when the TIADC 100 operates in the first mode, the control circuit 130 controls, through the control signal DSB, the digital correction circuit 120 to update the coefficients of the filter(s); and when the TIADC 100 operates in the second mode, the control circuit 130 controls, through the control signal DSB, the digital correction circuit 120 to stop updating the coefficients of the filter(s). Note that even though the digital correction circuit 120 stops updating the filter coefficients in the second mode, it can still use the current filter coefficients to correct the M digital output codes (D_1, D_2, . . . , D_M).

Several embodiments are provided below to discuss the time point or condition(s) where the control circuit 130 controls the TIADC 100 to switch mode.

In the first embodiment, the control circuit 130 determines whether the duration for which the TIADC 100 has been operating in the first mode is greater than a first threshold. If so (meaning that the coefficients of the filters of the digital correction circuit 120 do not need to be further adjusted or updated), the control circuit 130 controls the TIADC 100 to operate in the second mode. The control circuit 130 may use a timer or counter to time.

In the second embodiment, the control circuit 130 determines whether the error amount(s) of the corrected digital output code(s) D_2', D_M' is/are smaller than a second threshold. If so (meaning that the coefficients of the filters of the digital correction circuit 120 do not need to be further adjusted or updated), the control circuit 130 controls the TIADC 100 to operate in the second mode.

In the third embodiment, the control circuit 130 performs the fast Fourier transform (FFT) on the digital output signal Dout and determines whether the FFT result is greater than a third threshold. If so (meaning that the digital output signal Dout has become more correct), the control circuit 130 controls the TIADC 100 to operate in the second mode; otherwise, the control circuit 130 controls the TIADC 100 to operate in the first mode.

In the fourth embodiment, the control circuit 130 determines whether the operating voltage and/or the ambient temperature of the TIADC 100 has changed. If so (meaning that the coefficients of the filters of the digital correction circuit 120 may need to be further adjusted or updated), the control circuit 130 controls the TIADC 100 to operate in the first mode; otherwise, the control circuit 130 controls the TIADC 100 to operate in the second mode.

People having ordinary skill in the art can design the control unit 134 according to the above discussions, that is, the control unit 134 may be an application specific integrated circuit (ASIC) or embodied by circuits or hardware such as a programmable logic device (PLD).

The TIADC of the present invention can operate in the first mode or the second mode and includes a reference ADC. In the second mode, the reference ADC can be utilized to implement "pseudo random" for the purpose of suppressing timing skew tones; in the first mode, the reference ADC can be utilized to correct other ADCs (e.g., to correct the gain tone and offset tone) for the purpose of making the TIADC converge faster (compared to the TIADC that can only operate in the second mode).

Please note that the shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A time-interleaved analog-to-digital converter (TIADC) which operates in a first mode or a second mode, comprising:
    M ADCs for sampling an input signal according to M enable signals to generate M digital output codes, M being an integer greater than one;
    a reference analog-to-digital converter (ADC) for sampling the input signal according to a reference enable signal to generate a reference digital output code;
    a digital correction circuit for correcting the M digital output codes to generate M corrected digital output codes; and
    a control circuit for generating the M enable signals and the reference enable signal according to a clock;
    wherein in the first mode, the control circuit outputs the M corrected digital output codes in turn but does not output the reference digital output code; and
    wherein in the second mode, the control circuit randomly outputs the M corrected digital output codes and the reference digital output code.

2. The TIADC of claim 1, wherein in the first mode, the periods of the M enable signals are M times the period of the clock, and the period of the reference enable signal is M+1 times the period of the clock; in the second mode, the periods of the M enable signals and the reference enable signal are not fixed.

3. The TIADC of claim 2, wherein in the second mode, the control circuit selects, from any two of the reference ADC and the M ADCs, one ADC at random.

4. The TIADC of claim 2, wherein the TIADC outputs a digital output signal, the control circuit comprising:
    a selection circuit for receiving the M corrected digital output codes in the first mode and receiving the M corrected digital output codes and the reference digital output code in the second mode;
    a clock generation circuit for generating the M enable signals and the reference enable signal according to the clock; and
    a control unit, coupled to the selection circuit and the clock generation circuit, for controlling the selection circuit to determine the digital output signal from the M corrected digital output codes in the first mode, and for controlling the selection circuit to determine the digital output signal from the M corrected digital output codes and the reference digital output code in the second mode.

5. The TIADC of claim 2, wherein when the TIADC has been operating in the first mode longer than a time threshold, the control circuit controls the TIADC to operate in the second mode.

6. The TIADC of claim 2, wherein when the digital correction circuit indicates that an error amount of at least one of the M corrected digital output codes is less than a threshold, the control circuit controls the TIADC to operate in the second mode.

7. The TIADC of claim 2, wherein the TIADC outputs a digital output signal, the control circuit performs fast Fourier transform on the digital output signal, and the control circuit controls the TIADC to operate in the second mode when a result of the fast Fourier transform is greater than a threshold.

8. The TIADC of claim 2, wherein when the control circuit detects that at least one of an operating voltage and an ambient temperature of the TIADC changes, the control circuit controls the TIADC to operate in the first mode.

9. A time-interleaved analog-to-digital converter (TIADC) which operates in a first mode or a second mode to convert an input signal into a digital output signal, comprising:
    a first ADC for receiving the input signal and sampling the input signal according to a first enable signal to generate a first digital output code;
    a second ADC for receiving the input signal and sampling the input signal according to a second enable signal to generate a second digital output code;
    a third ADC for receiving the input signal and sampling the input signal according to a third enable signal to generate a third digital output code;
    a fourth ADC for receiving the input signal and sampling the input signal according to a fourth enable signal to generate a fourth digital output code;
    a reference ADC for receiving the input signal and sampling the input signal according to a reference enable signal to generate a reference digital output code;
    a digital correction circuit for correcting the first digital output code, the second digital output code, the third digital output code, and the fourth digital output code to respectively generate a first corrected digital output code, a second corrected digital output code, a third corrected digital output code, and a fourth corrected digital output code; and
    a control circuit for generating the first enable signal, the second enable signal, the third enable signal, the fourth enable signal, and the reference enable signal according to a clock;
    wherein in the first mode, the digital output signal is selected from a first digital output code group including the first corrected digital output code, the second corrected digital output code, the third corrected digital output code, and the fourth corrected digital output code; and
    wherein in the second mode, the digital output signal is selected from a second digital output code group including the first corrected digital output code, the second corrected digital output code, the third corrected digital output code, the fourth corrected digital output code, and the reference digital output code.

10. The TIADC of claim 9, wherein in the first mode, the periods of the first enable signal, the second enable signal, the third enable signal, and the fourth enable signal are four times the period of the clock, and the period of the reference enable signal is five times the period of the clock; in the second mode, the periods of the first enable signal, the second enable signal, the third enable signal, the fourth enable signal, and the reference enable signal are not fixed.

11. The TIADC of claim 10, wherein the control circuit comprises:
- a selection circuit for receiving the first digital output code group in the first mode and receiving the second digital output code group in the second mode;
- a clock generation circuit for generating the first enable signal, the second enable signal, the third enable signal, the fourth enable signal, and the reference enable signal according to the clock; and
- a control unit, coupled to the selection circuit and the clock generation circuit, for controlling the selection circuit to determine the digital output signal from the first digital output code group or the second digital output code group.

12. The TIADC of claim 10, wherein when the TIADC has been operating in the first mode longer than a time threshold, the control circuit controls the TIADC to operate in the second mode.

13. The TIADC of claim 10, wherein when the digital correction circuit indicates that an error amount of at least one of the first corrected digital output code, the second corrected digital output code, the third corrected digital output code, and the fourth corrected digital output code is less than a threshold, the control circuit controls the TIADC to operate in the second mode.

14. The TIADC of claim 10, wherein the control circuit performs fast Fourier transform on the digital output signal, and the control circuit controls the TIADC to operate in the second mode when a result of the fast Fourier transform is greater than a threshold.

15. The TIADC of claim 10, wherein when the control circuit detects that at least one of an operating voltage and an ambient temperature of the TIADC changes, the control circuit controls the TIADC to operate in the first mode.

* * * * *

UNITED STATES PATENT AND TRADEMARK OFFICE
CERTIFICATE OF CORRECTION

| | | |
|---|---|---|
| PATENT NO. | : 12,057,851 B2 | Page 1 of 1 |
| APPLICATION NO. | : 17/946521 | |
| DATED | : August 6, 2024 | |
| INVENTOR(S) | : Shih-Hsiung Huang, Jun Yang and Yu-Chang Chen | |

It is certified that error appears in the above-identified patent and that said Letters Patent is hereby corrected as shown below:

On the Title Page

Inventor's address should be listed as follows:
(72) Inventors: Shih-Hsiung Huang, Hsinchu (TW); Jun Yang, Suzhou (CN); Yu-Chang Chen, Hsinchu (TW)

Signed and Sealed this
Fourteenth Day of January, 2025

Derrick Brent
*Acting Director of the United States Patent and Trademark Office*